(12) United States Patent
Kim et al.

(10) Patent No.: US 9,576,739 B2
(45) Date of Patent: Feb. 21, 2017

(54) METAL OXIDE-CARBONACEOUS HYBRID THIN FILM AND PREPARING METHOD THEREOF

(71) Applicant: Ewha University—Industry Collaboration Foundation, Seoul (KR)

(72) Inventors: Dong Ha Kim, Seoul (KR); Yoon Hee Jang, Uijeongbu-si (KR)

(73) Assignee: Ewha University Industry Collaboration Foundation, Seoul (KR)

( * ) Notice: Subject to any disclaimer, the term of this patent is extended or adjusted under 35 U.S.C. 154(b) by 208 days.

(21) Appl. No.: 14/189,644

(22) Filed: Feb. 25, 2014

(65) Prior Publication Data

US 2014/0174514 A1 Jun. 26, 2014

Related U.S. Application Data

(63) Continuation of application No. PCT/KR2012/002109, filed on Mar. 23, 2012.

(30) Foreign Application Priority Data

Aug. 31, 2011 (KR) .................. 10-2011-0087641

(51) Int. Cl.
| | |
|---|---|
| *H01G 9/00* | (2006.01) |
| *H01G 9/20* | (2006.01) |
| *B82Y 10/00* | (2011.01) |
| *H01L 51/00* | (2006.01) |

(52) U.S. Cl.
CPC ............ *H01G 9/0036* (2013.01); *B82Y 10/00* (2013.01); *H01G 9/2027* (2013.01); *H01G 9/2031* (2013.01); *H01L 51/0045* (2013.01); *Y02E 10/542* (2013.01); *Y02P 70/521* (2015.11)

(58) Field of Classification Search
CPC .. H01G 9/2031; H01G 9/2027; H01G 9/0036; B82Y 10/00; Y02E 10/542
USPC ......................................................... 136/263
See application file for complete search history.

(56) References Cited

U.S. PATENT DOCUMENTS

| | | | |
|---|---|---|---|
| 2004/0084080 A1* | 5/2004 | Sager ................. | H01L 51/4226 136/263 |
| 2006/0046504 A1* | 3/2006 | Kayama ................ | B82Y 30/00 438/758 |

FOREIGN PATENT DOCUMENTS

| | | |
|---|---|---|
| KR | 10-2010-0126986 A | 12/2010 |
| KR | 10-1012123 B1 | 2/2011 |

OTHER PUBLICATIONS

Jang et al., "An unconventional route to high-efficiency dye-sensitized solar cells by embedded graphitic thin films into TiO2 nanoparticle photoanode" Nano Lett., Published Dec. 12, 2011.*
International Search Report issued in International App. No. PCT/KR2012/002109, mailed Oct. 10, 2012.
Min A. Cha; "Fabrication and Photocatalytic Activity of Hybrid TiO2 Nanostructures via Block Copolymer Self-Assembly"; Jul. 31, 2010.

(Continued)

*Primary Examiner* — Matthew Martin
(74) *Attorney, Agent, or Firm* — Greer, Burns & Crain, Ltd.

(57) ABSTRACT

The present disclosure relates to a metal oxide-carbonaceous hybrid thin film, a preparing method of the metal oxide-carbonaceous hybrid thin film, and a dye-sensitized solar cell using a photoelectrode including the metal oxide-carbonaceous hybrid thin film.

3 Claims, 8 Drawing Sheets a) Preparing a metal oxide-carbonaceous hybrid thin film containing arrayed metal oxide nanoparticles b) Dye-sensitized solar cell containing a metal oxide-carbonaceous hybrid thin film (56) References Cited

OTHER PUBLICATIONS

Xue Li et al.; "Au/Titania Composite Nanoparticle Arrays with Controlled Size and Spacing by Organic-Inorganic Nanohybridization in Thin Film Block Copolymer Templates"; Bull. Korean Chem. Soc. 2007, vol. 28, No. 6, pp. 1015-1020, Jun. 20, 2007.

Melanie Siebert et al.; "Reactive Amphiphilic Block Copolymers for the Preparation of Hybrid Organic/Inorganic Materials with Covalent Interactions"; Soft Matter, 2011, pp. 587-593, Nov. 15, 2010.

* cited by examiner

FIG. 1A

FIG. 1B b) Dye-sensitized solar cell containing a metal oxide-carbonaceous hybrid thin film

METAL OXIDE-CARBONACEOUS HYBRID THIN FILM AND PREPARING METHOD THEREOF

CROSS-REFERENCE TO RELATED APPLICATION

This application is a continuation of International Application No. PCT/KR2012/002109 filed on Mar. 23, 2012, claiming the priority based on Korean Patent Application No. 10-2011-0087641 filed on Aug. 31, 2011, the contents of all of which are incorporated herein by reference in their entirety.

TECHNICAL FIELD

The present disclosure relates to a metal oxide-carbonaceous hybrid thin film, a preparing method of the metal oxide-carbonaceous hybrid thin film, and a dye-sensitized solar cell using a photoelectrode including the metal oxide-carbonaceous hybrid thin film.

BACKGROUND ART

Since the Gratzel group in Swiss reported a dye-sensitized solar cell in 1991, which can be prepared at low costs, to replace the commercialized amorphous silicon solar cell, there have been active researches on improving photo-conversion efficiency of the dye-sensitized solar cell.

With respect to principle for operation of the dye-sensitized solar cell, when photosensitive dye molecules adsorbed to an n-type nanoparticle oxide semiconductor are exposed to the sunlight, electrons are excited. The excited electrons are transferred to a conductive transparent substrate through the oxide semiconductor. The transferred electrons are transferred to a counter electrode through an external circuit so that currents flow. At this time, holes formed in the photosensitive dye molecules are reduced again by a redox electrolyte. During this process, the oxidized electrolyte component receives electrons from the counter electrode so as to be reduced. The maximum efficiency of the dye-sensitized solar cell operating based on the above-described principle is currently about 11%.

Researches for promoting commercialization of a dye-sensitized solar cell are being actively conducted over the whole world. Five (5) representative strategies for the commercialization of the dye-sensitized solar cell can be summarized as follows: (i) research on a photosensitive dye, which can absorb light of entire wavelength bands including a visible light region and an infrared region; (ii) research on controlling a structural form of an n-type nanoparticle oxide semiconductor in order to maximize adsorption of a photosensitive dye and injection of electrons; (iii) research on a redox electrolyte which induces stable and effective reduction; (iv) research for replacing an expensive platinum electrode; and (v) research on improvement of stability of a solar cell.

With respect to the strategy (ii) among the five (5) representative strategies above, Korean Patent Application Publication No. 10-2010-0126986, which relates to a "photoelectrode using a conductive non-metallic film and a dye-sensitized solar cell containing the same," and others disclose more effective preparation of a photoelectrode for a dye-sensitized solar cell. However, there have no sufficient researches conducted on improving the photo-conversion efficiency of the dye-sensitized solar cell by preparing a hybrid material by using carbons and other materials, and then, using the hybrid material as a part of the photoelectrode for the dye-sensitized solar cell.

DISCLOSURE OF THE INVENTION

Problems to be Solved by the Invention

Accordingly, the inventors of the present disclosure discovered that the metal oxide-carbonaceous hybrid thin film can be easily and economically prepared by a method including a direct carbonization step using stabilization, heat treatment, etc., and the photo-conversion efficiency of the dye-sensitized solar cell can be improved by using a photoelectrode containing the metal oxide-carbonaceous hybrid thin film. Based on the discovery, they completed the present disclosure.

Thus, the present disclosure provides a metal oxide-carbonaceous hybrid thin film, a method for preparing the metal oxide-carbonaceous hybrid thin film, and a dye-sensitized solar cell using a photoelectrode containing the metal oxide-carbonaceous hybrid thin film.

However, the problems sought to be solved by the present disclosure are not limited to those described above. Other problems, which are sought to be solved by the present disclosure but are not described in this document, can be clearly understood by one of ordinary skill in the art from the descriptions below.

Means for Solving the Problems

A first aspect of the present disclosure provides a method for preparing a metal oxide-carbonaceous hybrid thin film, which includes the following steps:

(a) preparing a solution containing a reversed micelle of a self-assembled block copolymer;

(b) adding a metal oxide precursor and an acid solution to the solution to prepare a metal oxide-containing reversed micelle solution;

(c) coating the metal oxide-containing reversed micelle solution on a substrate to prepare a metal oxide-self-assembled block copolymer hybrid thin film;

(d) stabilizing the metal oxide-self-assembled block copolymer hybrid thin film; and (e) heating the stabilized metal oxide-self-assembled block copolymer hybrid thin film for carbonization.

A second aspect of the present disclosure provides a metal oxide-carbonaceous hybrid thin film prepared by the method according to the first aspect of the present disclosure.

A third aspect of the present disclosure provides a dye-sensitized solar cell, including a photoelectrode including a structure containing at least one metal oxide-carbonaceous hybrid thin film according to the first and second aspect of the present disclosure formed on a conductive transparent substrate and at least one metal oxide layer, and an adsorbed photosensitive dye; a counter electrode facing to the photoelectrode; and an electrolyte located between the photoelectrode and the counter electrode.

Effect of the Invention

When a metal oxide-carbonaceous hybrid thin film is prepared according to the method of the present disclosure, it is possible to easily and economically prepare the metal oxide-carbonaceous hybrid thin film by performing a direct carbonization step through stabilization by an ultraviolet irradiation to a self-assembled block copolymer, etc., heat treatment, and others, without using a separate precursor or an activating catalyst for generation of carbons. The metal oxide-carbonaceous hybrid thin film can contain arrayed metal oxide nanoparticles despite the fact that the preparation method thereof includes the heat treatment step. This is because the self-assembled block copolymer is used as a template for the arrayed metal oxide nanoparticles, and furthermore, undergoes the stabilization step prior to the heat treatment step.

When a photoelectrode containing the metal oxide-carbonaceous hybrid thin film is prepared and used as a component of a dye-sensitized solar cell, it is observed that a photo-conversion efficiency of the dye-sensitized solar cell significantly increases. This is because the metal oxide-carbonaceous hybrid thin film contains the arrayed metal oxide nanoparticles as well as carbons having high electrical conductivity. The carbons having high electrical conductivity promote transfer of excited electrons, and thereby, improving the photo-conversion efficiency of the dye-sensitive solar cell. The dye-sensitized solar cell is advantageous in that it can be prepared at low costs, compared to a conventional silicon solar cell. However, since the dye-sensitized solar cell exhibits somewhat low photo-conversion efficiency, there has been difficulty in commercializing the dye-sensitized solar cell. However, in the case where the metal oxide-carbonaceous hybrid thin film prepared according to the present disclosure is used for the photoelectrode for the dye-sensitized solar cell, the photo-conversion efficiency can be improved while not significantly increasing the preparation costs, and thereby, contributing to the commercialization of the dye-sensitized solar cell.

BRIEF DESCRIPTION OF THE DRAWINGS

Non-limiting and non-exhaustive embodiments of the present disclosure will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

BEST MODE FOR CARRYING OUT THE INVENTION

Hereinafter, illustrative embodiments and examples of the present disclosure will be described in detail with reference to the accompanying drawings so that inventive concept may be readily implemented by those skilled in the art.

However, it is to be noted that the present disclosure is not limited to the illustrative embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element.

Throughout the whole document, the term "comprises or includes" and/or "comprising or including" means that one or more other components, steps, operations, and/or the existence or addition of elements are not excluded in addition to the described components, steps, operations and/or elements.

Through the whole document, the term "on" that is used to designate a position of one element with respect to another element includes both a case that the one element is adjacent to the another element and a case that any other element exists between these two elements.

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

The terms "about or approximately" or "substantially" used throughout the whole document are intended to have meanings close to numerical values or ranges specified with an allowable error and intended to prevent accurate or absolute numerical values disclosed for understanding of the present invention from being illegally or unfairly used by any unconscionable third party. The term "step of" used throughout the whole document does not mean "step for".

Throughout the whole document, the description of "A and/or B" means "A or B, or A and B."

Hereinafter, illustrative embodiments and examples of the present disclosure are described with reference to the accompanying drawings.

A first aspect of the present disclosure provides a method for preparing a metal oxide-carbonaceous hybrid thin film, which includes the following steps:

(a) preparing a solution containing a reversed micelle of a self-assembled block copolymer;

(b) adding a metal oxide precursor and an acid solution to the solution to prepare a metal oxide-containing reversed micelle solution;

(c) coating the metal oxide-containing reversed micelle solution on a substrate to prepare a metal oxide-self-assembled block copolymer hybrid thin film;

(d) stabilizing the metal oxide-self-assembled block copolymer hybrid thin film; and (e) heating the stabilized metal oxide-self-assembled block copolymer hybrid thin film for carbonization.

In accordance with an illustrative embodiment of the present disclosure, the self-assembled block copolymer of the step (a) above may include an amphiphilic self-assembled block copolymer, but is not limited thereto. The self-assembled block copolymer may be, for example, a diblock copolymer, a triblock copolymer or a self-assembled type polymer that can be carbonized, but is not limited thereto.

The self-assembled block copolymer can function as a template to enable the metal oxide-carbonaceous hybrid thin film to contain arrayed metal oxide nanoparticles. Simultaneously, the self-assembled block copolymer can function as a carbon precursor. Accordingly, in case of using the self-assembled block copolymer, it is possible to prepare the metal oxide-carbonaceous hybrid thin film containing regular and high-ordered metal oxide nanoparticles without using a separate carbon precursor. However, the present disclosure is not limited thereto.

In the "amphiphilic" self-assembled block copolymer, the term "amphiphilic" means that the self-assembled block copolymer has been formed containing a hydrophilic block and a hydrophobic block. Accordingly, when either the hydrophilic block or the hydrophobic block contained in the amphiphilic self-assembled block copolymer is dissolved in a certain solvent, a reverse micelle of the self-assembled block copolymer can be formed within the solution. However, the present disclosure is not limited thereto.

In accordance with an illustrative embodiment of the present disclosure, the self-assembled block copolymer of the step (a) may include a member selected from the group consisting of [poly(styrene-block-ethylene oxide)] (PS-b-PEO), poly[styrene-block-(4-vinylpyridine)] (PS-b-P4VP), poly[styrene-block-(2-vinylpyridine)] (PS-b-P2VP), poly[styrene-block-acrylonitril] (PS-b-PAN), poly[acrylonitril-block-n-butyl acrylate] (PAN-b-PBA), poly[acrylonitril-block-ϵ-carprolactone] (PAN-b-PCL), poly[ethyleneoxide-propylene-ethylene oxide] (pluronic PEO-PPO-PEO), and combinations thereof, but is not limited thereto.

In accordance with an illustrative embodiment of the present disclosure, the solution in the step (a) may include one prepared by using a solvent which selectively dissolves only one type of blocks among the blocks contained in the self-assembled block copolymer, but is not limited thereto. For example, the solvent may selectively dissolve only one of the hydrophilic block and the hydrophobic block contained in the self-assembled block copolymer, but is not limited thereto. For example, the solvent may selectively dissolve only the hydrophobic block, such as a styrene block, contained in the self-assembled block copolymer, but is not limited thereto.

In accordance with an illustrative embodiment of the present disclosure, the solvent of the step (a) may include a member selected from toluene, chloroform, tetrahydrofuran (THF), dimethylformamide (DMF), benzene, cyclohexane, hexane, ethyl acetate, heptane, xylene, and combinations thereof, but is not limited thereto.

In accordance with an illustrative embodiment of the present disclosure, the solution of the step (a) may contain of the self-assembled block copolymer from approximately 0.1 wt % to approximately 1 wt %, for example, from approximately 0.5 wt % to approximately 1 wt % or from approximately 0.1 wt % to approximately 0.5 wt %, but is not limited thereto. If the self-assembled block copolymer is contained in a concentration of less than approximately 0.1 wt %, it is difficult to form a flawless uniform monomolecular film from the solution of the step (a). If the self-assembled block copolymer is contained in a concentration of more than approximately 1 wt %, it would be impossible to form a monomolecular film itself from the solution of the step (a). That is, the solution of the step (a) contains the self-assembled block copolymer in the concentration of from approximately 0.1 wt % to approximately 1 wt % in order to form a flawless uniform reverse micelle monomolecular film. The wt % concentration can be controlled by harmonizing a concentration of the solution and a spinning velocity upon spin coating, but is not limited thereto.

In accordance with an illustrative embodiment of the present disclosure, the metal oxide precursor of the step (b) may include a member selected from the group consisting of a titanium dioxide precursor, a zinc oxide precursor, a niobium pentoxide precursor, and combinations thereof, but is not limited thereto. As the titanium dioxide precursor, for example, titanium tetraisopropoxide, titanium tetrabutoxide, or titanium alkoxide can be used, without being limited thereto. As the zinc oxide precursor, for example, zinc acetate dihydrate, zinc acetylacetonate monohydrate, or zinc nitrate hexahydrate can be used, without being limited thereto. As the niobium pentoxide precursor, for example, niobium pentachloride can be used, without being limited thereto. In addition, as the metal oxide precursor, a composite of the above-enumerated materials can be used, without being limited thereto.

In accordance with an illustrative embodiment of the present disclosure, the metal oxide precursor of the step (b) may be added to have a molar ratio of from approximately 0.5 to approximately 4.0 with respect to hydrophilic block or hydrophobic block of the self-assembled block copolymer, but is not limited thereto. The self-assembled block copolymer that has included both the hydrophilic block and the hydrophobic block is partially dissolved during the step (a) by the solvent that selectively dissolves either the hydrophilic block or the hydrophobic block. Undissolved blocks are agglomerated to form a core of a reverse micelle, and the dissolved blocks are released and exist in a chain form in a shell of a reverse micelle. For example, if the solvent is a solvent that selectively dissolves the hydrophobic block, the hydrophilic blocks are agglomerated to form a core of a reverse micelle, and the hydrophobic blocks exist in a chain form in a shell of a reverse micelle. In this case, the metal oxide precursor of the step (b) may be added to have a molar ratio of from approximately 0.5 to approximately 4.0 to the hydrophilic block of the self-assembled block copolymer that has not been dissolved and have formed the core of the reverse micelle, but is not limited thereto.

The metal oxide precursor may be bound to the hydrophilic block of the self-assembled block copolymer through coordination bond, but is not limited thereto.

In accordance with an illustrative embodiment of the present disclosure, the acid solution of the step (b) may include a water, an alcohol, an acid, and a chelating reagent, but is not limited thereto. As the chelating reagent, for example, acetyl acetone can be used, without being limited thereto.

When the metal oxide precursor and the acid solution are added to the solution of the step (a) in the step (b), the metal oxide precursor and the acid solution causes a sol-gel reaction to form a sol-gel solution such that the sol-gel solution can contain metal oxide nanoparticles, without being limited thereto.

With respect to the metal oxide precursor and the acid solution added to the solution of the step (a) in order to prepare the metal oxide-containing reverse micelle solution in the step (b), for example, the metal oxide precursor may be first added, and subsequently, the acid solution may be added, without being limited thereto.

Alcohol included in the acid solution may be selected from the group consisting of 2-propanol, ethanol, methanol, 2-methoxyethanol, and combinations thereof, but is not limited thereto.

The sol-gel reaction can be further promoted by using a catalyst. As the catalyst, concentrated hydrochloric acid or acetic acid can be used, without being limited thereto.

Water and the chelating reagent included in the acid solution may be used to cause a hydration reaction and a chelating reaction such that the metal oxide precursor is bound to the hydrophilic block of the self-assembled block copolymer through coordination bond, but are not limited thereto.

In accordance with an illustrative embodiment of the present disclosure, the chelating reagent of the acid solution of the step (b) may be added to have a molar ratio of from approximately 4.0 to approximately 8.0 with respect to the metal oxide precursor, but is not limited thereto.

In accordance with an illustrative embodiment of the present disclosure, the substrate of the step (c) may include a silicon wafer substrate, a quartz substrate, a glass substrate, or a conductive substrate, but is not limited thereto. The conductive substrate may be, for example, conductive oxide substrates such as ITO and FTO but is not limited thereto.

For example, the metal oxide-self-assembled block copolymer hybrid thin film in the step (c) may be formed by coating the metal oxide-containing reverse micelle solution prepared in the step (b) on the substrate using spin coating, but is not limited thereto.

A velocity of the spin coating may be, for example, from approximately 2,000 rpm to approximately 3,000 rpm, but is not limited thereto. If the velocity of the spin coating is less than approximately 2,000 rpm, there would be a problem in that the metal oxide-self-assembled block copolymer hybrid thin film is generated only in a multi-layer film form. If the velocity of the spin coating is more than approximately 3,000 rpm, there would be a problem in that the metal oxide-self-assembled block copolymer hybrid thin film having a uniform thickness and uniform density is not formed. However, the velocity of the spin coating may not be limited thereto.

In accordance with an illustrative embodiment, the stabilization of the step (d) may be performed by an ultraviolet irradiation or an addition of a crosslinking agent, but is not limited thereto.

The "stabilization" of the step (d) may mean curing the self-assembled block copolymer by reducing mobility of and crosslinking polymer chains contained in the self-assembled block copolymer in the metal oxide-self-assembled block copolymer hybrid thin film prepared through the steps (a) to (c). Accordingly, the shape of the self-assembled block copolymer can be maintained even though steps such as oxidation, reduction, and heat treatment, etc. are conducted after the stabilization step. Especially, the present disclosure is advantageous in that the "stabilization" of the step (d) precedes the heat treatment of the step (e), and thus, even though the carbonization step is performed by heat treatment in the step (e), the self-assembled block copolymer is not combusted into carbon dioxide and is converted directly into carbons so as to increase a yield rate of carbons. However, the reason for performing the stabilization step is not limited thereto. By performing the step (d), it is possible to easily prepare the metal oxide-carbonaceous hybrid thin film, in which metal oxide nanoparticles are arrayed and introduced on a carbonaceous matrix.

The "stabilization" of the step (d) may be performed by an ultraviolet irradiation, but is not limited thereto. For example, if the stabilization of the step (d) is performed by the ultraviolet irradiation, the stabilization can be performed by irradiating an ultraviolet ray having a wavelength of from approximately 200 nm to approximately 400 nm to the metal oxide-self-assembled block copolymer hybrid thin film under a vacuum condition at energy intensity of from approximately 20 W/cm$^2$ to approximately 30 W/cm$^2$ for from approximately 30 minutes to approximately 180 minutes, but is not limited thereto.

In addition, the "stabilization" of the step (d) may be performed by addition of a crosslinking agent, but is not limited thereto. As the crosslinking agent which is used for the stabilization, any crosslinking agent that is commonly used to crosslink polymer chains can be used without limitation. Through the stabilization step, it is possible to obtain a patterned metal oxide-self-assembled block copolymer hybrid thin film containing arrayed metal oxide nanoparticles.

In accordance with an illustrative embodiment of the present disclosure, the stabilization of the step (d) may be performed under a vacuum condition, but is not limited thereto.

In accordance with an illustrative embodiment of the present disclosure, the heat treatment of the step (e) may be performed in the presence of an inert gas, but is not limited thereto. The heat treatment of the step (e) may be a step for directly carbonizing the self-assembled block copolymer part of the metal oxide-self-assembled block copolymer hybrid thin film to prepare the metal oxide-carbonaceous hybrid thin film, but is not limited thereto. The heat treatment may be a step that is performed in the presence of an inert gas for a short time. As the inert gas, an argon (Ar) gas or a nitrogen ($N_2$) gas can be used, without being limited thereto.

In accordance with an illustrative embodiment of the present disclosure, the heat treatment of the step (e) may be performed at a temperature of from approximately 500° C. to approximately 800° C., for example, from approximately 550° C. to approximately 800° C., from approximately 600° C. to approximately 800° C., from approximately 650° C. to approximately 800° C., from approximately 700° C. to approximately 800° C., from approximately 500° C. to approximately 750° C., from approximately 500° C. to approximately 700° C., from approximately 500° C. to approximately 650° C., or from approximately 500° C. to approximately 600° C., but is not limited thereto.

In accordance with an illustrative embodiment of the present disclosure, the metal oxide-carbonaceous hybrid thin film may contain the arrayed metal oxide nanoparticles, but is not limited thereto.

A second aspect of the present disclosure provides a metal oxide-carbonaceous hybrid thin film prepared by the method according to the first aspect of the present disclosure.

A third aspect of the present disclosure provides a dye-sensitized solar cell, including: a photoelectrode including a structure containing at least one metal oxide-carbonaceous hybrid thin film according to the first aspect of the present disclosure formed on a conductive transparent substrate and at least one metal oxide layer, and an adsorbed photosensitive dye; a counter electrode facing to the photoelectrode; and, an electrolyte located between the photoelectrode and the counter electrode.

The photoelectrode of the dye-sensitized solar cell contains at least one metal oxide-carbonaceous hybrid thin film so as to improve the photo-conversion efficiency of the dye-sensitized solar cell, but is not limited thereto. The metal oxide-carbonaceous hybrid thin film contains carbon parts having high electrical conductivity so as to contribute to effective electron transfer, and as a result, improve the photo-conversion efficiency. In addition, if the method according to the first aspect of the present disclosure is used to prepare the metal oxide-carbonaceous hybrid thin film, the metal oxide-carbonaceous hybrid thin film containing arrayed metal oxide nanoparticles is prepared. This can also contribute to the photo-conversion efficiency. In addition, in the metal oxide-carbonaceous hybrid thin film, the carbons, and the metal oxide are hybridized, and thereby, reducing a band gap of the metal oxide. As a result, effects on effective electron transfer and improvement of the photo-conversion efficiency can be achieved.

The conductive transparent substrate contained in the photoelectrode of the dye-sensitized solar cell can be prepared by depositing a conductive transparent electrode on a transparent substrate. Here, as the transparent substrate, any material that has transparency so as to enable incidence of external light can be used without limitation. For example, a glass substrate or a transparent polymer substrate can be used. As a material for the transparent polymer substrate that can be used as the transparent substrate, for example, polypropylene (PP), polyimide (PI), polyethyleneterephthalate (PET), polyethylenenaphthalate (PEN), polycarbonate (PC), triacetylcellulose (TAC), or a copolymer thereof can be used, without being limited thereto. The conductive transparent electrode formed on the transparent substrate may be formed containing a conductive metal oxide selected from the group consisting of an indium tin oxide (ITO), a fluorine tin oxide (FTO), an antimony tin oxide (ATO), a zinc oxide (ZnO), a tin oxide ($SnO_2$), $ZnO$—$Ga_2O_3$, $ZnO$—$Al_2O_3$, $SnO_2$—$Sb_2O_3$, and combinations thereof. For example, the conductive transparent electrode may contain a tin oxide ($SnO_2$), which has excellent conductivity, transparency, and heat resistance, or an indium tin oxide (ITO), which is inexpensive, but is not limited thereto. The conductive transparent substrate is intended to enable light like the sunlight to penetrate and be incident into the substrate so that it can be used as a layered porous photoelectrode. The meaning of the term "transparent" in this specification describing the present disclosure includes the case where light transmission of a material is high, as well as the case where light transmission of a material is 100%.

A blocking layer may be formed on the conductive transparent substrate, if necessary. The blocking layer enhances adhesion between the substrate and the structure. The blocking layer can be formed by coating an oxide on the substrate to have a consistent thickness. The blocking layer can be formed by coating a material known in the art of the present disclosure on the substrate through a method known in the art of the present disclosure. For example, the blocking layer can be formed by deposition, electrolysis, or a wet step, but is not limited thereto. A material for the blocking layer and the number of times, conditions, etc., for heat treatment to form the blocking layer can be variously modified within the scope, in which the objectives of the present disclosure can be achieved. For example, the blocking layer may include an oxide of a transition metal selected from the group consisting of Ti, Cu, Zn, Sr, In, Yr, La, V, Mo, W, Sn, Nb, Mg, Al, Y, Sc, Sm, Ga, and combinations thereof, but is not limited thereto. For example, the blocking layer can be formed by applying a 0.1 M $TiCl_4$ aqueous solution on the conductive transparent substrate through spin coating method, and then, heating the conductive transparent substrate at a temperature of 450° C., but is not limited thereto.

Next, the photosensitive dye contained in the photoelectrode is adsorbed to the structure in order to use the structure as the photoelectrode of the dye-sensitized solar cell. Once light is incident and absorbed to dye molecules contained in the photosensitive dye, a photoelectron is generated. The generated photoelectron is transferred to the conductive transparent substrate through the structure as a passageway. For example, by immersing the structure in the solution containing the photosensitive dye, the photosensitive dye can be adsorbed and coated on the internal and external surfaces of the structure. As the photosensitive dye, any photosensitive dye known in the art of the present disclosure can be used without limitation. For example, a dye in a composite form of metals including aluminum (Al), platinum (Pt), palladium (Pd), europium (Eu), lead (Pb), iridium (Ir), or ruthenium (Ru) can be used, without being limited thereto. Especially, since ruthenium (Ru) belongs to the platinum group and can form many organic metal composites, a photosensitive dye containing ruthenium (Ru) is largely used. For example, the Ru (etc $bpy)_2(NCS)_2 \cdot CH_3CN$ type is being largely used. Here, etc means $(COOEt)_2$ or $(COOH)_2$. In addition, a photosensitive dye containing an organic pigment, etc., can be used. As the organic pigment, for example, there are riboflavin, triphenylmethane, coumarin, porphyrin, xanthine, etc. These materials can be used solely or in a form of combination with a ruthenium (Ru) composite so as to improve absorption of a visible light having a long wavelength and contribute to improvement of the photo-conversion efficiency of the dye-sensitized solar cell.

Meanwhile, among the components of the dye-sensitized solar cell, the counter electrode is positioned facing to the photoelectrode containing the conductive transparent substrate, the structure, and the photosensitive dye. The counter electrode may include the conductive transparent substrate, on which the conductive transparent electrode is formed, and selectively, the conductive layer formed on the conductive transparent electrode.

The conductive transparent substrate of the counter electrode can be formed by coating or depositing a conductive transparent electrode on a transparent substrate, like the conductive transparent substrate used for the photoelectrode. Here, as the transparent substrate, any material that has transparency to enable incidence of external light can be used without limitation. For example, a glass substrate or a transparent polymer substrate can be used. As a material for the transparent polymer substrate, for example, polypropylene (PP), polyimide (PI), polyethyleneterephthalate (PET), polyethylenenaphthalate (PEN), polycarbonate (PC), triacetylcellulose (TAC), or a copolymer thereof can be used, without being limited thereto. In addition, the conductive transparent electrode formed on the transparent substrate may include a conductive metal oxide selected from the group consisting of indium tin oxide (ITO), fluorine tin oxide (FTO), antimony tin oxide (ATO), zinc oxide (ZnO), tin oxide ($SnO_2$), $ZnO$—$Ga_2O_3$, $ZnO$—$Al_2O_3$, $SnO_2$—$Sb_2O_3$, and combinations thereof. For example, the conductive transparent electrode formed on the transparent substrate may include a tin oxide ($SnO_2$), which has excellent conductivity, transparency, and heat resistance, or an indium tin oxide (ITO), which is inexpensive, but is not limited thereto. Here, the reason for adopting the conductive transparent substrate is to enable the sunlight to penetrate the substrate and be incident internally. The meaning of the term "transparent" in this specification describing the present disclosure includes the case where light transmission of a material is high, as well as the case where light transmission of a material is 100%.

Meanwhile, the conductive layer contained in the counter electrode functions as activating a redox couple and may include conductive materials such as platinum (Pt), gold (Au), ruthenium (Ru), palladium (Pd), rhodium (Rh), iridium (Ir), osmium (Os), carbon (C), a tungsten oxide ($WO_3$), a titanium dioxide ($TiO_2$), or a conductive polymer. The conductive layer formed on one surface of the counter electrode exhibits excellent efficiency as reflectivity is high. Accordingly, it is preferable to select a material having high reflectivity.

A sealing part may be formed at edges of the photoelectrode and the counter electrode. The sealing part may include a thermoplastic polymer material and is cured by heat or ultraviolet ray. As a specific example, the sealing part may include an epoxy resin, but is not limited thereto. For example, as the sealing part, a polymer film having a thickness of tens of micrometers may be inserted between the photoelectrode and the counter electrode to maintain an interval.

Meanwhile, as the electrolyte among the components of the dye-sensitized solar cell, for example, a gel type electrolyte, a liquid electrolyte, or a sold electrolyte can be used, without being limited thereto.

In accordance with an illustrative embodiment of the present disclosure, it may be possible to include the metal oxide-carbonaceous hybrid thin film formed on an uppermost layer and/or a lowest layer of the structure, without being limited thereto. For example, the lowest layer of the structure contained in the photoelectrode of the dye-sensitized solar cell, i.e., the portion of the structure in contact with the conductive transparent substrate may be the metal oxide-carbonaceous hybrid thin film. The uppermost layer of the structure contained in the photoelectrode of the dye-sensitized solar cell, i.e., the portion of the structure farthest away from the conductive transparent substrate may be the metal oxide-carbonaceous hybrid thin film. Or, the metal oxide-carbonaceous hybrid thin film may be positioned on both the uppermost layer and the lowest layer of the structure. However, the present disclosure is not limited thereto.

The photo-conversion efficiency of the dye-sensitized solar cell may vary depending on in which portion of the photoelectrode the metal oxide-carbonaceous hybrid thin film is positioned. Also, the photo-conversion efficiency of the dye-sensitized solar cell may vary depending on how many layers of the metal oxide-carbonaceous hybrid thin film are contained in the photoelectrode. However, the present disclosure is not limited thereto. For example, if the metal oxide-carbonaceous hybrid thin film is positioned close to the conductive transparent substrate of the photoelectrode, it is possible to promote transfer of electrons excited in an interface between the metal oxide-carbonaceous hybrid thin film and the conductive transparent substrate. In addition, for example, if the metal oxide-carbonaceous hybrid thin film is positioned between the metal oxide layers of the photoelectrode, it is possible to promote transfer of electrons between the metal oxide layers. Furthermore, if the metal oxide-carbonaceous hybrid thin film is contained in a multiple layer form in the photoelectrode, the photo-conversion efficiency can be increased by complex operation.

Hereinafter, the present disclosure is described in more detail with reference to examples, but not limited thereto.

EXAMPLES

Example 1

Preparation of a Titanium Dioxide-Carbonaceous Hybrid Thin Film (a) Preparation of a Reverse Micelle Solution In order to prepare a reverse micelle solution, polystyrene-block-poly(4-vinylpyridine) (PS-b-P4VP, $M_{n,PS}$=41,000 g/mol, $M_{n,P4VP}$=24,000 g/mol, $M_n/M_w$=1.09, Polymer Source, Inc.) was used as a self-assembled block copolymer. Toluene was used as a solvent. Specifically, the reverse micelle solution was prepared by dissolving polystyrene-block-poly(4-vinylpyridine) (PS-b-P4VP) in a concentration of approximately 0.5 wt % in toluene.

(b) Preparation of a Titanium Dioxide-Containing Reverse Micelle Solution

In order to prepare a titanium dioxide-containing reverse micelle solution, a titanium oxide precursor and an acid solution were added to the reverse micelle solution prepared in the step (a). Titanium tetra-isopropoxide (Aldrich), which was used as the titanium dioxide precursor, was added to the reverse micelle solution to have a molar ratio of Ti/4VP=0.5 to vinylpyridine of the reverse micelle solution. Thereafter, the solution was stirred at a room temperature for 24 hours. A mixture solution of ethanol, distilled water, acetylacetone, and a hydrochloric acid, which was used as the acid solution, contained ethanol:distilled water:acetylacetone:a hydrochloric acid at a molar ratio of approximately 10:10:20:0.05. The acid solution was added to have a molar ratio of approximately acetylacetone/Ti=4 to titanium tetra-isopropoxide added to the reverse micelle solution. Thereafter, the solution was stirred at a room temperature for 24 hours, so that the titanium dioxide-containing reverse micelle solution was prepared.

(c) Preparation of a Titanium Dioxide-Self-Assembled Block Copolymer Hybrid Thin Film A titanium dioxide-self-assembled block copolymer hybrid thin film was prepared by coating the titanium dioxide-containing reverse micelle solution prepared in the step (b) on a substrate. As the method for performing the coating, a method for conducting spin coating at 2,000 rpm for 60 seconds was adopted.

(d) Stabilization of the Titanium Dioxide-Self-Assembled Block Copolymer Hybrid Thin Film Stabilization of the titanium dioxide-self-assembled block copolymer hybrid thin film prepared in the step (c) was performed through an ultraviolet irradiation. Specifically, the titanium dioxide-self-assembled block copolymer hybrid thin film was placed in a vacuum vessel and irradiated by an ultraviolet ray having a 254 nm wavelength at energy intensity of 25 W/cm² for 1 hour, so as to induce stabilization of the self-assembled block copolymer through crosslinking curing.

(e) Carbonization of the Titanium Dioxide-Self-Assembled Block Copolymer Hybrid Thin Film The titanium dioxide-self-assembled block copolymer hybrid thin film stabilized through the step (d) was subject to heat treatment for carbonization, so that a titanium dioxide-carbonaceous hybrid thin film was completed. Specifically, the titanium dioxide-self-assembled block copolymer hybrid thin film was put into a furnace and subject to heat treatment in an argon (Ar) atmosphere at 600° C. for 1 hour to enable direct carbonization of the self-assembled block copolymer. As a result, the titanium dioxide-carbonaceous hybrid thin film containing arrayed titanium dioxide nanoparticles was completed.

Example 2

Preparation I of a Photoelectrode for a Dye-Sensitized Solar Cell Containing the Titanium Dioxide-Carbonaceous Hybrid Thin Film (1) Preparation of a Conductive Transparent Substrate As a conductive transparent substrate included in the photoelectrode for the dye-sensitized solar cell, a fluorine doped tin oxide (FTO) substrate was used in this Example 2. The FTO substrate was used after being washed with each of an acetone solution, a methanol solution, and a 2-propanol solution for 30 minutes through sonification.

(2) Formation of the Titanium Dioxide-Carbonaceous Hybrid Thin Film

The titanium dioxide-carbonaceous hybrid thin film was formed on the FTO substrate according to the method of Example 1.

(3) Formation of a Titanium Dioxide Layer

In order to form a titanium dioxide layer on the titanium dioxide-carbonaceous hybrid thin film, a P25 titanium dioxide paste was prepared and used. The P25 titanium dioxide paste was prepared by dissolving approximately 15 wt % of the commercialized P25 titanium dioxide (Degussa) in ethanol, distilled water, and concentrated polyethylene glycol (PEG), and then, stirring the solution at a room temperature for 12 hours. The prepared P25 titanium dioxide paste was applied on the titanium dioxide-carbonaceous hybrid thin film. The thin film was dried at a room temperature and heated at a temperature of 500° C. for 30 minutes, so that the titanium dioxide layer was formed.

(4) Adsorption of a Photosensitive Dye and Use Thereof as the Photoelectrode for the Dye-Sensitized Solar Cell The photoelectrode for the dye-sensitized solar cell was completed by adsorbing a photosensitive dye to the FTO/titanium dioxide-carbonaceous hybrid thin film/P25 titanium dioxide layer prepared through the steps (1) to (3). Specifically, the photoelectrode for the dye-sensitized solar cell, to which a photosensitive dye is adsorbed, was completed by immersing the FTO/titanium dioxide-carbonaceous hybrid thin film/P25 titanium dioxide layer in a N719 dye solution dissolved in ethanol for 24 hours. The photoelectrode was used together with a counter electrode coated with platinum, an electrolyte, and a sealing film having a 25 μm thickness as components of the dye-sensitized solar cell.

Example 3

Preparation II of the Photoelectrode for the Dye-Sensitized Solar Cell Containing the Titanium Dioxide-Carbonaceous Hybrid Thin Film The photoelectrode for the dye-sensitized solar cell of Example 3 was prepared by the same step as that of Example 2, except that Example 3 changed the order of the steps (2) and (3) of Example 2 so that the photoelectrode of Example 3 contains a FTO/P25 titanium dioxide layer/titanium dioxide-carbonaceous hybrid thin film.

Example 4

Preparation III of the Photoelectrode for the Dye-Sensitized Solar Cell Containing the Titanium Dioxide-Carbonaceous Hybrid Thin Film The photoelectrode for the dye-sensitized solar cell of Example 4 was prepared by the same step as that of Example 2, except that Example 4 performed the step (2) of Example 2 once more after the step (3) of Example 2 so that the photoelectrode of Example 4 contains a FTO/titanium dioxide-carbonaceous hybrid thin film/P25 titanium dioxide layer/titanium dioxide-carbonaceous hybrid thin film.

EXPERIMENTAL EXAMPLES

Experimental Example 1

Figure 1A:
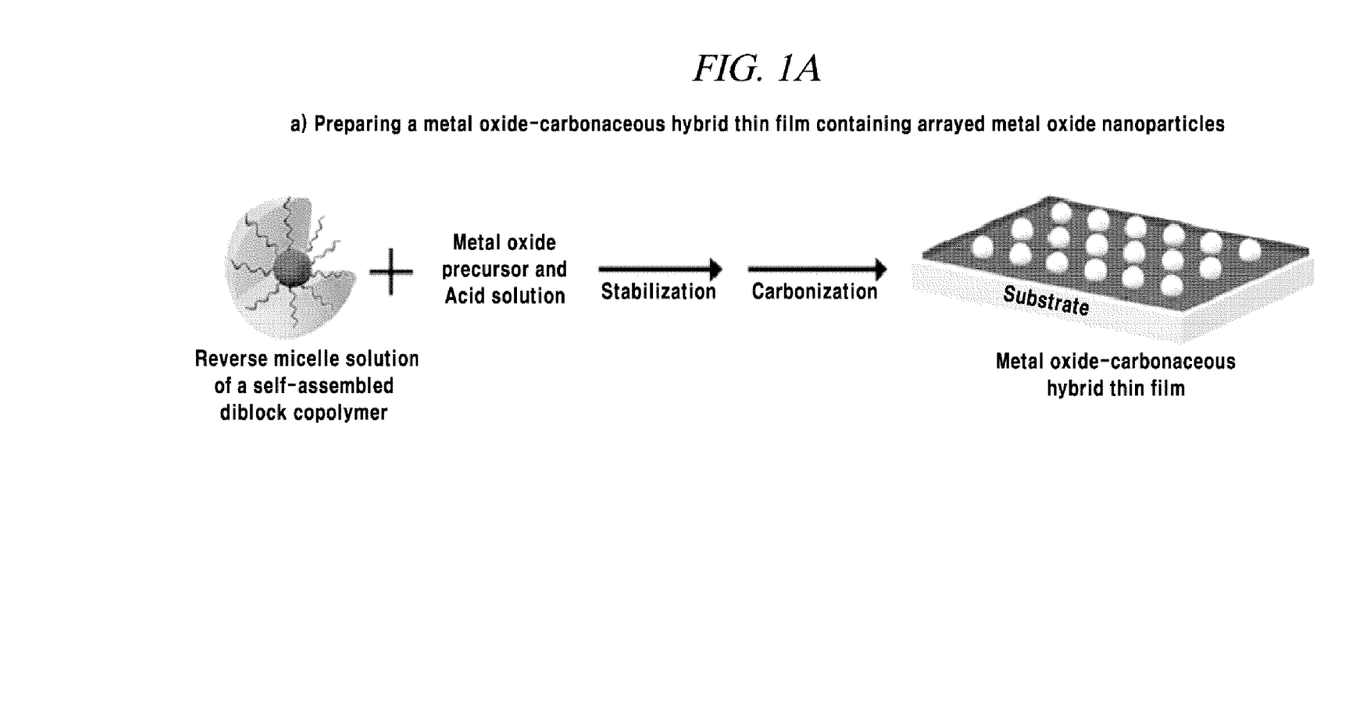
FIG. 1A is a schematic view of a method for preparing a metal oxide-carbonaceous hybrid thin film.
Figure 1B:
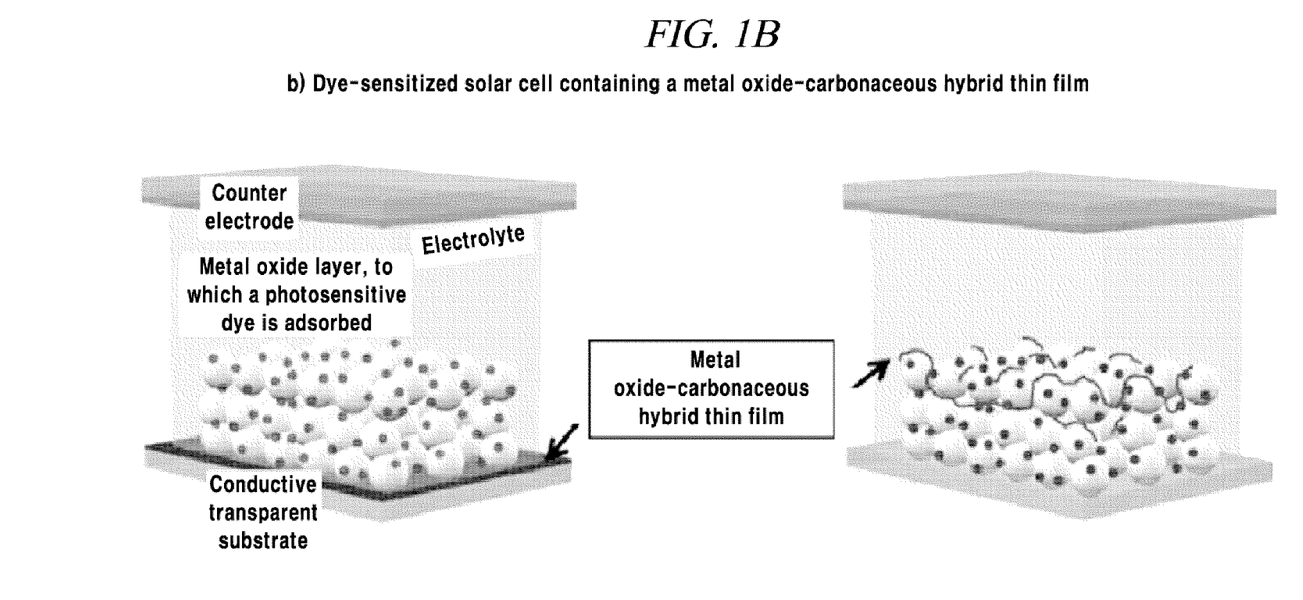
FIG. 1B is a schematic view of a dye-sensitized solar cell containing the metal oxide-carbonaceous hybrid thin film, in accordance with an illustrative embodiment of the present disclosure.
Figure 2:
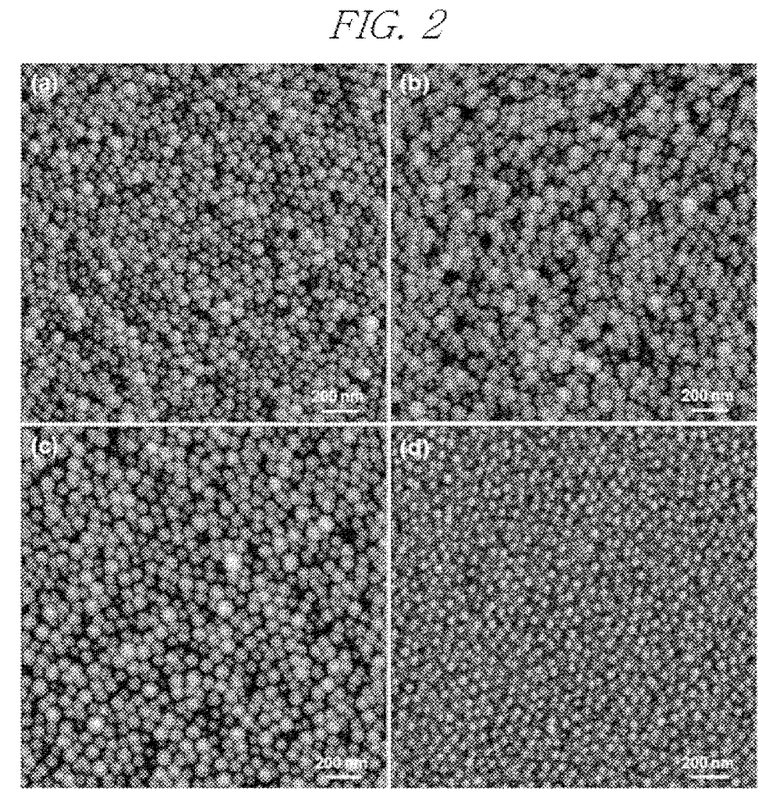
FIG. 2 provides atomic force microscope (AFM) photographs showing a surface form of a metal oxide-carbonaceous hybrid thin film prepared in accordance with Example 1 of the present disclosure.
Figure 3:
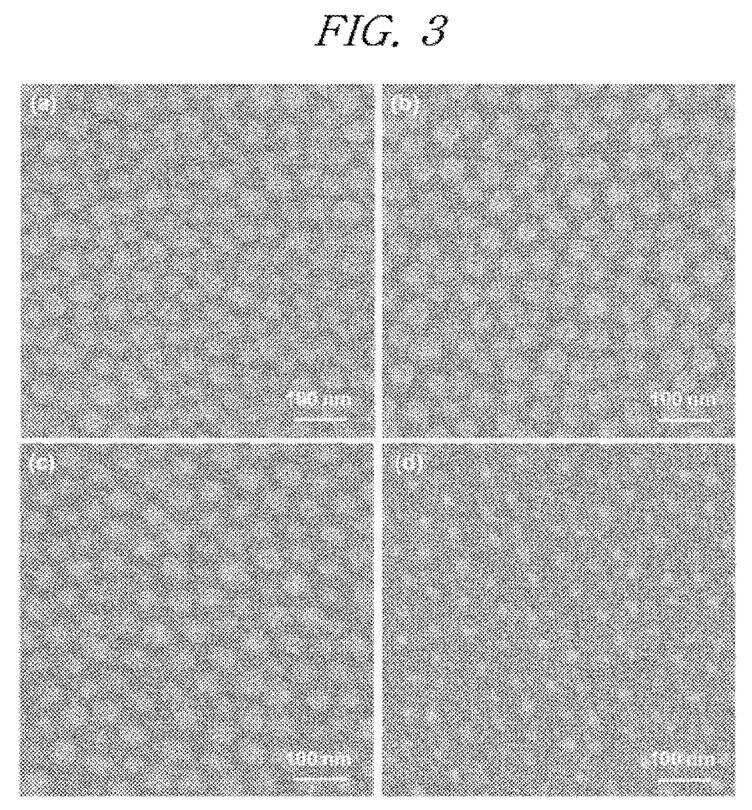
FIG. 3 provides scanning electron microscope (SEM) photographs showing a surface form of a metal oxide-carbonaceous hybrid thin film prepared in accordance with Example 1 of the present disclosure.

Analysis of a Surface Form of the Titanium Dioxide-Carbonaceous Hybrid Thin Film In order to identify a surface form of the titanium dioxide-carbonaceous hybrid thin film prepared according to the examples of the present disclosure, analysis using an atomic force microscope (AFM) and a scanning electron microscope (SEM) was performed. FIGS. 2 and 3 provide the analysis results.

FIG. 2($a$) is an AFM image obtained by photographing a substrate spin-coated with the reverse micelle solution prepared in the step (a) of Example 1. FIG. 2($b$) is an AFM image obtained by photographing a substrate spin-coated with the titanium dioxide-containing reverse micelle solution prepared in the step (b) of Example 1. FIG. 2($c$) is an AFM image obtained by photographing the surface of the titanium dioxide-self-assembled block copolymer hybrid thin film stabilized by the ultraviolet irradiation in the step (d) of Example 1. FIG. 2($d$) is an AFM image obtained by photographing the surface of the titanium dioxide-carbonaceous hybrid thin film directly carbonized by heat treatment in the step (e) of Example 1. FIGS. 3($a$) to 3($d$) correspond to FIGS. 2($a$) to 2($d$) and are different from FIGS. 2($a$) to 2($d$) only in that FIGS. 3($a$) to 3($d$) are SEM images, and not AFM images.

In FIGS. 2($a$) and 3($a$), a reverse micelle structure of regularly arrayed polystyrene-block-poly(4-vinylpyridine) was observed. In FIGS. 2($b$) and 3($b$), a nano dot array of a hexagonal close-packed structure similar to FIGS. 2($a$) and 3($a$) was observed. The nano dot array of the hexagonal close-packed structure was also observed in FIGS. 2($c$) and 3($c$) following the stabilization through the ultraviolet irradiation. Also, the nano dot array of the hexagonal close-packed structure was observed in FIGS. 2($d$) and 3($d$) following the carbonization through the heat treatment at 600° C. Thus, it was identified that since the self-assembled block copolymer was stabilized by performing the ultraviolet irradiation in the step (d), the regular nano dot array was maintained while the nanoparticles are not agglomerated, despite that the high temperature heat treatment step was performed later in the step (e).

Experimental Example 2

Figure 4:
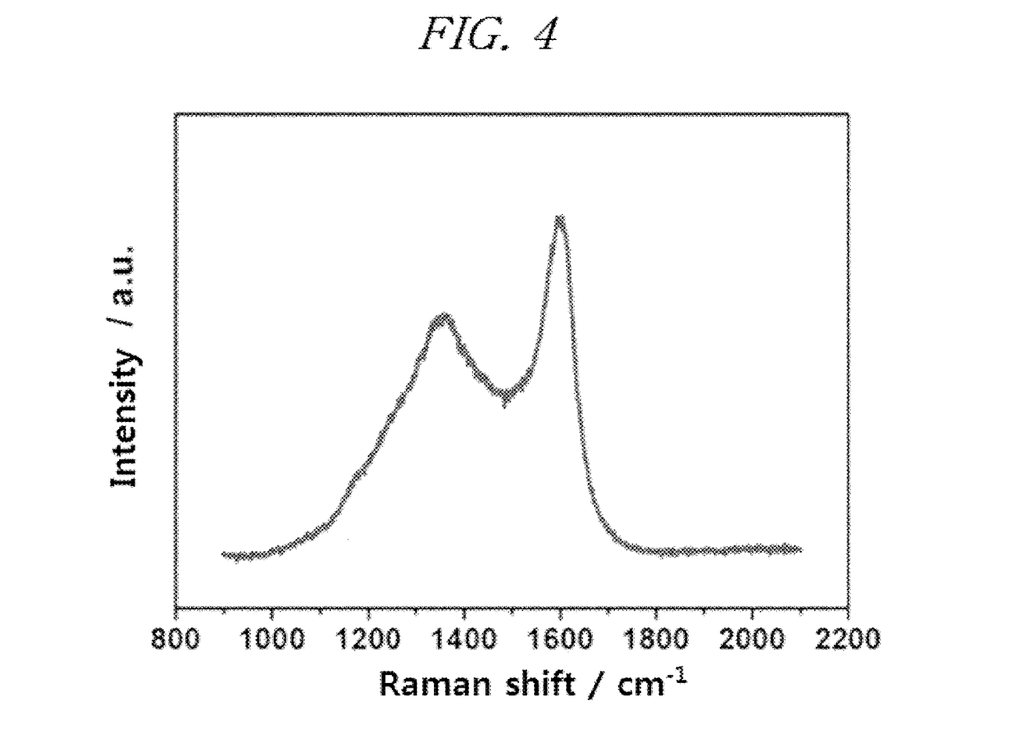
FIG. 4 is a spectrum showing an optical characteristic of a metal oxide-carbonaceous hybrid thin film prepared by a method of Example 1 of the present disclosure.

Analysis of an Optical Characteristic of the Titanium Dioxide-Carbonaceous Hybrid Thin Film In order to identify an optical characteristic of the titanium dioxide-carbonaceous hybrid thin film prepared according to the examples of the present disclosure, analysis using a Raman spectroscopy (Macro Raman experiment, 488 nm, 25 mW) was performed. FIG. 4 provides the analysis results.

According to the Raman absorption spectrum of FIG. 4, it was identified that the titanium dioxide-carbonaceous hybrid thin film prepared in Example 1 exhibits a D band and a G band, which are characteristic peaks of carbons in the wavelength regions of 1350 $cm^{-1}$ and 1600 $cm^{-1}$, respectively. This means that part of the titanium dioxide-carbonaceous hybrid thin film prepared according to the examples of the present disclosure retains the same property as that of graphite. Especially, from the fact that the peak of G band was observed in the wavelength region of 1600 $cm^{-1}$, it was identified that crystalline carbons were formed.

Experimental Example 3

Figure 5:
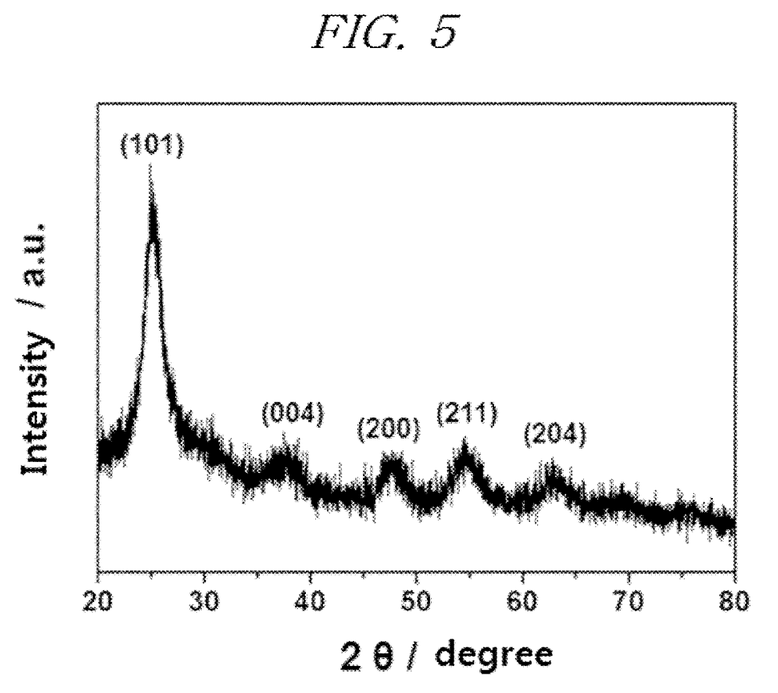
FIG. 5 is an X-ray diffraction (XRD) spectrum showing a crystalline structure of a metal oxide-carbonaceous hybrid thin film prepared by a method of Example 1 of the present disclosure.

Analysis of a Crystalline Structure of the Titanium Dioxide-Carbonaceous Hybrid Thin Film In order to identify a crystalline structure of the titanium dioxide-carbonaceous hybrid thin film prepared according to the examples of the present disclosure, analysis using the X-ray diffraction (XRD) device was performed. FIG. 5 provides the analysis results.

From the characteristic peaks of the X-ray diffraction (XRD) device in FIG. 5, it was identified that the titanium dioxide nanoparticles contained in the titanium dioxide-carbonaceous hybrid thin film prepared according to Example 1 above have the anatase structure.

Experimental Example 4

Analysis of Conductivity of the Titanium Dioxide-Carbonaceous Hybrid Thin Film

Figure 6:
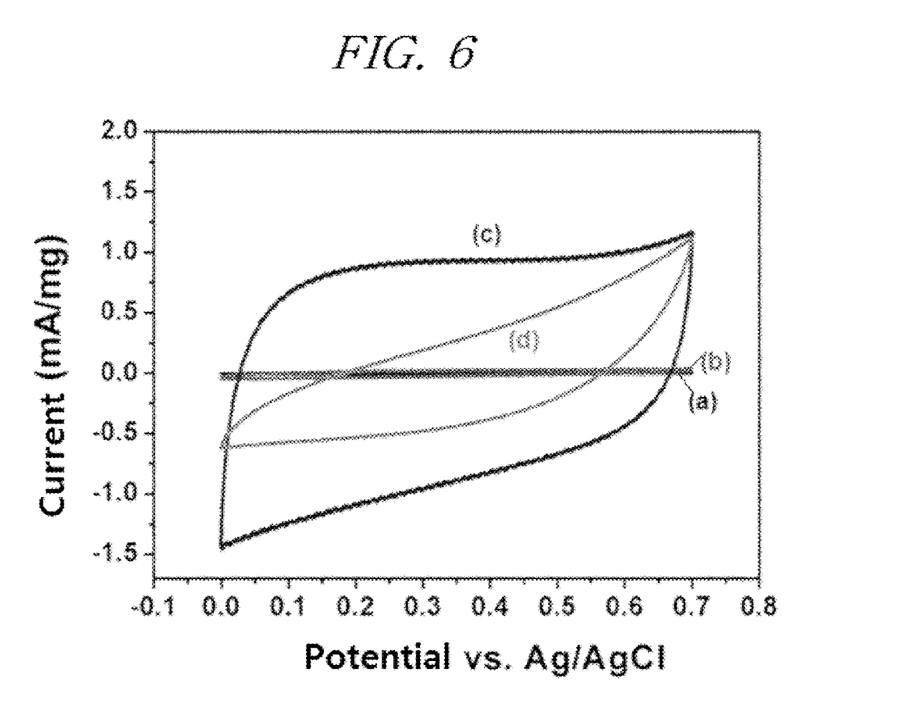
FIG. 6 is a cyclic voltammetry (CV) analysis graph showing conductivity of a metal oxide-carbonaceous hybrid thin film prepared by a method of Example 1 of the present disclosure.

In order to evaluate conductivity of the titanium dioxide-carbonaceous hybrid thin film prepared according to the examples of the present disclosure, analysis using cyclic voltammetry (CV) was performed. FIG. 6 provides the evaluation results.

FIG. 6(a) is a CV curve of a glassy carbon electrode. FIG. 6(b) is a CV curve in the case where a P25 titanium dioxide layer was formed on the glassy carbon electrode. FIG. 6(c) is a CV curve in the case where a carbon thin film was formed on the glassy carbon electrode. FIG. 6(d) is a CV curve in the case where the titanium dioxide-carbonaceous hybrid thin film was formed on the glassy carbon electrode.

According to the CV curves of FIG. 6, it was identified that more currents flow in case of FIGS. 6(c) and 6(d), compared to FIG. 6(b). FIG. 6(d), in which the titanium dioxide-carbonaceous hybrid thin film was formed, exhibited the lower current amount than that of FIG. 6(c), in which the carbon thin film was formed. This is expected that titanium dioxide exhibits lower conductivity than that of carbons.

Experimental Example 5

Evaluation of Photo-Conversion Efficiency of the Dye-Sensitized Solar Cell Containing the Photoelectrodes of Examples 2 to 4

In Examples 2 to 4, photoelectrodes containing the titanium dioxide-carbonaceous hybrid thin film prepared according to Example 1 were prepared. In order to evaluate the photo-conversion efficiency of the dye-sensitized solar cell containing the photoelectrode of each of Examples 2 to 4, the sunlight with a condition of one-sun was irradiated to the dye-sensitized solar cell. After measuring the current density-voltage (J-V) curve, the results were provided in FIG. 7.

Figure 7:
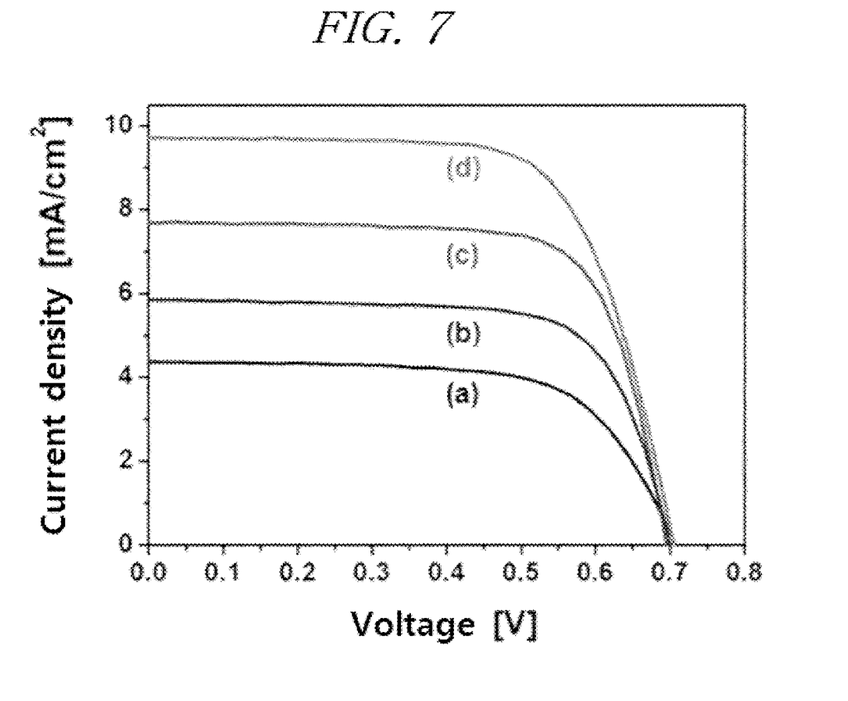
FIG. 7 is a current density-voltage (J-V) graph for evaluating photo-conversion efficiency of a dye-sensitized solar cell containing a photoelectrode prepared according to Examples 2 to 4 of the present disclosure.

As a comparative example, FIG. 7(a) is a J-V curve of a dye-sensitized solar cell prepared by using a photoelectrode, which does not contain the titanium dioxide-carbonaceous hybrid thin film prepared in Example 1. FIG. 7 (b) is a J-V curve of a dye-sensitized solar cell prepared by using a photoelectrode, which contains the titanium dioxide-carbonaceous hybrid thin film prepared in Example 2. FIG. 7(c) is a J-V curve of a dye-sensitized solar cell prepared by using a photoelectrode, which contains the titanium dioxide-carbonaceous hybrid thin film prepared in Example 3. FIG. 7(d) is a J-V curve of a dye-sensitized solar cell prepared by using a photoelectrode, which contains the titanium dioxide-carbonaceous hybrid thin film prepared in Example 4.

According to the J-V curves of FIG. 7, it was identified that the photo-conversion efficiency of FIGS. 7(b) to 7(d), which relate to the dye-sensitized solar cell prepared by using the photoelectrode containing the titanium dioxide-carbonaceous hybrid thin film, was increased, compared to FIG. 7(a), which is the comparative example. Especially, a short-circuit current density value was greatly increased. This is expected that the titanium dioxide-carbonaceous hybrid thin film exhibits high conductivity, as shown in FIG. 6.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:

1. A dye-sensitized solar cell, comprising:
   a photoelectrode including a structure containing at least one metal oxide-carbonaceous hybrid thin film, a conductive transparent substrate, at least one metal oxide layer, and an adsorbed photosensitive dye, wherein the at least one metal oxide-carbonaceous hybrid thin film includes crystalline carbon, and wherein the at least one metal oxide-carbonaceous hybrid thin film is formed from metal oxide precursor selected from the group consisting of a zinc oxide precursor, a niobium pentoxide precursor, a titanium oxide precursor, and mixtures thereof;
   a counter electrode facing to the photoelectrode; and
   an electrolyte located between the photoelectrode and the counter electrode.

2. The dye-sensitized solar cell of claim 1, wherein the metal oxide-carbonaceous hybrid thin film is formed between the at least one metal oxide layer and the conductive transparent substrate.

3. The dye-sensitized solar cell of claim 1, wherein the metal oxide-carbonaceous hybrid thin film is formed between the at least one metal oxide layer and the counter electrode.

* * * * *